United States Patent [19]

Rizzo

[11] Patent Number: 5,508,664
[45] Date of Patent: Apr. 16, 1996

[54] OSCILLATORS HAVING CHARGE/DISCHARGE CIRCUITS WITH ADJUSTMENT TO MAINTAIN DESIRED DUTY CYCLES

[75] Inventor: Raymond P. Rizzo, Vestal, N.Y.

[73] Assignee: International Business Machines Corporation, Armonk, N.Y.

[21] Appl. No.: 425,761

[22] Filed: Apr. 20, 1995

[51] Int. Cl.[6] .......................... H03K 3/017; H03K 3/0231
[52] U.S. Cl. ............................................. 331/111; 331/143
[58] Field of Search ....................... 331/111, 143

[56] References Cited

U.S. PATENT DOCUMENTS

| | | | |
|---|---|---|---|
| 3,742,384 | 6/1973 | Breitzmann et al. | 331/111 |
| 4,260,959 | 4/1981 | Allgood | 331/111 |
| 4,692,717 | 9/1987 | Ouyang et al. | 331/111 |

Primary Examiner—Siegried H. Grimm
Attorney, Agent, or Firm—Arthur J. Samodovitz

[57] ABSTRACT

An oscillator comprises a comparator and first and second switches for alternately connecting first and second respective reference voltages to a first input of the comparator. A capacitor is connected to a second input of the comparator, and a current source and a current sink are alternately connected to the capacitor via third and fourth switches. The first and third switches are closed simultaneously based on one output level of the comparator, and the second and fourth switches are closed simultaneously based on the other output level of the comparator. This causes the output of the compartor to alternate and thereby generate an oscillation signal. To provide precision in the duty cycles, either the second reference voltage, the current source or the current sink is adjusted to maintain desired duty cycles of the high and low levels output from the comparator. The adjustment to the second reference voltage, current source or current sink is based on an average voltage of the capacitor in relation to a third reference voltage.

24 Claims, 6 Drawing Sheets

OSCILLATORS HAVING CHARGE/DISCHARGE CIRCUITS WITH ADJUSTMENT TO MAINTAIN DESIRED DUTY CYCLES

BACKGROUND OF THE INVENTION

The invention relates generally to electronic oscillators and deals more particularly with an oscillator exhibiting high and low levels with different duty cycles.

Oscillators (or "astable multivibrators") are used in a variety of circuits such as power supplies. Oscillators with frequencies less than 100 MHz are often formed from an amplifier 10 with both positive and negative feedback as illustrated by the prior art oscillator 8 of FIG. 1. The positive feedback is made via a resistor 11, and the negative feedback is made via a resistor 12. A voltage divider comprising resistors 16 and 18 supplies a reference voltage to the noninverting input of the amplifier, and a capacitor 20 connects the inverting input to ground. When the output of the amplifier exhibits a level, a fraction immediately appears at the noninverting input. The amplifier 10 exhibits a high level and begins to charge capacitor 20 via resistor 12. When capacitor 20 charges to the fractional level exhibited at the noninverting input, the output of the amplifier changes to the low level. A fraction of this low level immediately appears at the noninverting input, and also begins to discharge capacitor 20. When capacitor 20 discharges below the fractional level exhibited at the noninverting input, the output of the amplifier changes back to the high level. This process continuously repeats itself yielding alternating high and low levels at the output of the amplifier such that the amplifier output forms an oscillation signal. This oscillation signal is symmetrical in that each of the output levels of the amplifier has a 50% duty cycle. The values of the resistors and capacitor 20 determine the overall frequency. The manufacturing tolerances of the resistors and capacitor, if integrated, and changes in temperature on both discrete and integrated components also affect the overall frequency.

In some types of power supplies, it is desirable to have an asymmetrical oscillator in which the high and low levels have different duty cycles from each other. The longer duty cycle level can be used to set the basic frequency of operation for the power supply, and the shorter duty cycle level can be used to cause a dead time between complementary power switches to ensure that both switches are not closed during the switching transition. In the prior art circuit of FIG. 1, if a diode 22 and series resistor 24 are connected in parallel with resistor 12, then the oscillator becomes asymmetrical with one output level existing for more than 50% of the cycle and the other output level existing for less than 50% of the cycle. The values of the resistors and capacitor 20 determine the overall frequency and duty cycle of each output level. The manufacturing tolerances of the resistors and capacitor, if integrated, and temperature also affect the overall frequency and the duty cycle of each output level. In some applications, the shorter duration level may be required for 50–100 nanoseconds. At such a short duration, the foregoing affects of manufacturing tolerance and temperature are significant and present a real problem with the design of FIG. 1.

FIG. 2 illustrates another asymmetrical oscillator 25 according to the prior art; Oscillator 25 provides greater precision than oscillator 8 of FIG. 1. The asymmetrical oscillator 25 of FIG. 2 includes a comparator 30 and switches 32 and 34 interposed between respective reference voltages 36 and 38 and the noninverting input of the comparator. The asymmetrical oscillator also includes a discrete capacitor 39 connected between the inverting input and ground, a current source 40 for charging the capacitor through a switch 42 and another current source 43 for discharging the capacitor through another switch 44. The opening and closing of the switches 32, 34, 42 and 44 is controlled by the output of the comparator such that when the comparator 30 outputs a high level, switches 32 and 42 are open and switches 34 and 44 are closed. Conversely, when the comparator 30 outputs a low level, switches 32 and 42 are closed and switches 34 and 44 are open.

The basic operation of oscillator 25 is as follows. When switches 32 and 42 are closed (and switches 34 and 44 are open) based on a high level output from comparator 30, the higher reference voltage 36 is applied to the noninverting input of the comparator and current from current source 40 begins to charge capacitor 39. When the voltage across capacitor 39 exceeds the reference voltage 36, the comparator switches to its low level. This opens switches 32 and 42 and closes switches 34 and 44. Then, the lower reference voltage 38 is applied to the noninverting input of the comparator, and current sink 43 begins to discharge capacitor 39. When the voltage across capacitor 39 drops below the reference voltage 38, the comparator switches back to the high level. Thus, the comparator output alternates between its high and low levels creating an oscillation signal.

The magnitudes of the reference voltages 36 and 38 and current sources 40 and 43 determine the frequency of the switching of comparator 30, and the magnitudes of current sources 40 and 43 determine the duty cycles of the high and low levels output from comparator 30. Assuming the voltage references and discrete capacitor have high precision, the precision of the oscillator is limited by the tolerances of and temperature effects on the current sources.

While the oscillator 25 of FIG. 2 provides better precision than the oscillator 8 of FIG. 1, improvements are required for even better precision on the overall frequency of the oscillator and high and low level duty cycles.

Accordingly, a general object of the present invention is to provide an asymmetrical oscillator with better precision of the overall frequency and high and low level duty cycles than the prior art.

SUMMARY OF THE INVENTION

The present invention resides in an oscillator comprising a comparator and first and second switches for alternately connecting first and second respective reference voltages to a first input of the comparator. A capacitor is connected to a second input of the comparator, and a current source and a current sink are alternately connected to the capacitor via third and fourth switches. The first and third switches are closed simultaneously based on one output level of the comparator, and the second and fourth switches are closed simultaneously based on the other output level of the comparator. This causes the output of the comparator to alternate and thereby generate an oscillation signal. To provide precision in the duty cycles according to the present invention, the second reference voltage is adjusted to maintain desired duty cycles of the high and low levels output from the comparator. According to one feature of the present invention, the adjustment to the second reference voltage is based on an average voltage of the capacitor in relation to a third reference voltage.

According to another inventive oscillator, instead of adjusting one of the reference voltages, either the current source or the current sink is adjusted to maintain desired duty cycles of the high and low levels output from the comparator.

DETAILED DESCRIPTION OF THE PREFERRED EMBODIMENTS

Figure 3:
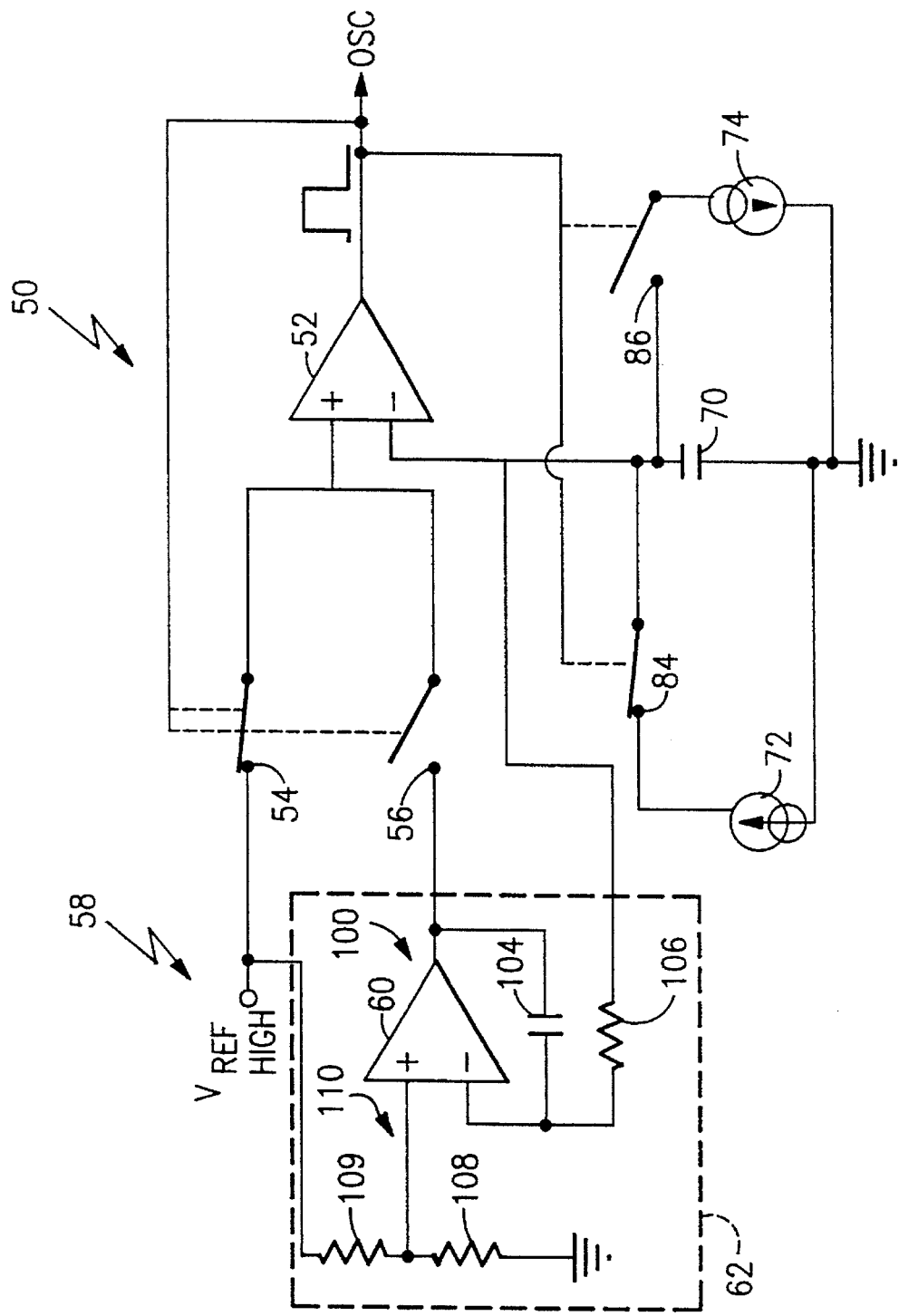
FIG. 3 is a circuit diagram of an asymmetrical oscillator according to the present invention.

Referring now to the drawings in detail wherein like reference numbers indicate like elements through the several figures, FIG. 3 illustrates an asymmetrical oscillator generally designated 50 according to the present invention. Oscillator 50 comprises a comparator 52, a switch 54 which interconnects a fixed reference voltage 58 to the noninverting input of the comparator and a switch 56 which alternately interconnects a variable reference voltage 60 to the noninverting input of the comparator. Reference voltage 58 is always greater than reference voltage 60, and can be provided by a band gap reference or other known reference circuit. Reference voltage 60 is provided by the output of an averaging circuit 62 described below. A discrete capacitor 70 is connected between the inverting input of comparator 52 and ground. A current source 72 charges capacitor 70 when a switch 84 is closed, and a current sink 74 discharges capacitor 70 when a switch 86 is closed. The output of comparator 52 controls the opening and closing of switches 54, 56, 84 and 86 such that when the comparator outputs a high level, switches 54 and 84 are closed and switches 56 and 86 are open and when the comparator outputs a low level, switches 54 and 84 are open and switches 56 and 86 are closed.

The basic operation, without the averaging circuit 62, is as follows. When the output of comparator 52 is high, switches 54 and 84 are closed. Thus, the higher reference voltage 58 is applied to the noninverting input of comparator 52, and current source 72 charges capacitor 70. When the voltage across capacitor 70 exceeds the reference voltage 58, the comparator 52 switches to the low level. This opens switches 54 and 84 and closes switches 56 and 86. With switch 56 now closed, the lower reference voltage 60 is applied to the noninverting input of comparator 52 and with switch 86 closed, current sink 74 discharges capacitor 70. When the voltage across capacitor 70 falls below the reference voltage 60, comparator 52 switches back to the high level. Thus, the output of comparator 52 oscillates.

Figure 1:
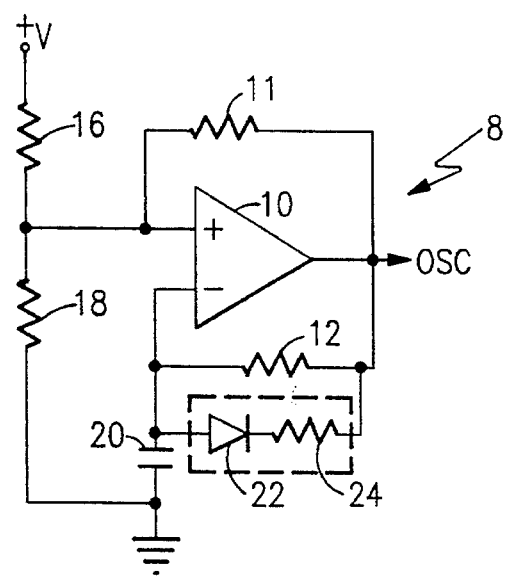
FIG. 1 is a circuit diagram of a symmetrical oscillator (and asymmetrical oscillator in broken box) according to the prior art.
Figure 2:
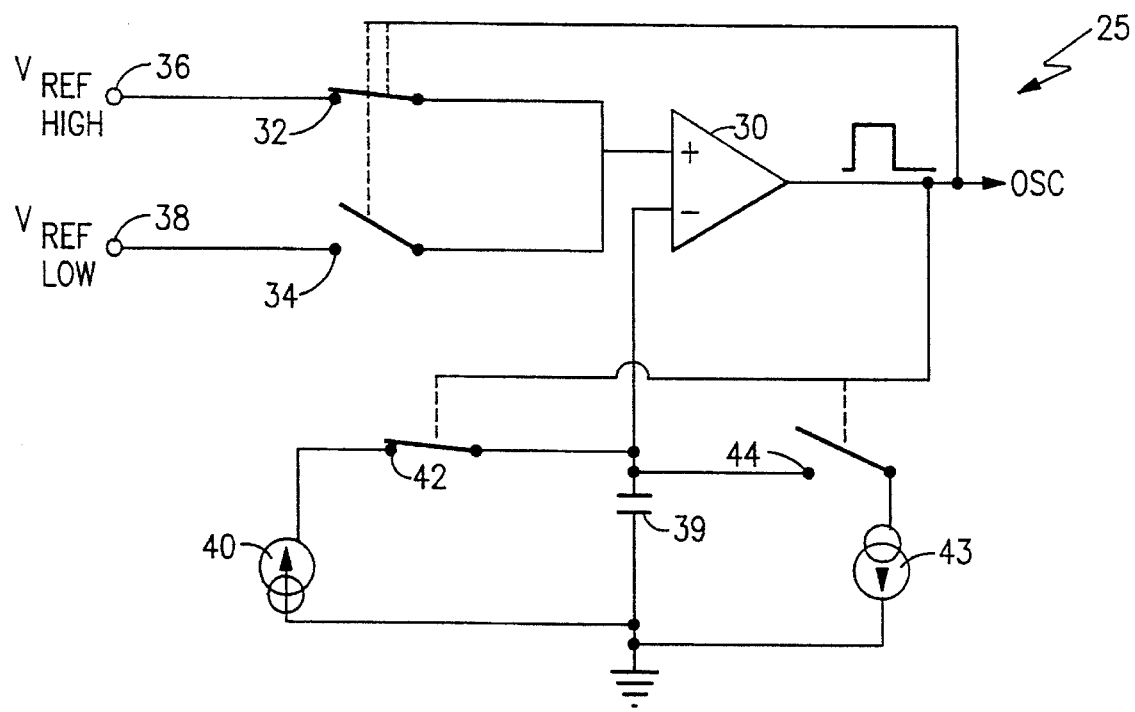
FIG. 2 is a circuit diagram of another asymmetrical oscillator according to the prior art.

In contrast to the prior art oscillator 25 of FIG. 2, the oscillator 50 of FIG. 3 includes the averaging circuit 62 to adjust the lower reference voltage 56 as necessary to maintain a precise duty cycle for each level. Averaging circuit 62 comprises an amplifier 100, a negative feedback capacitor 104 and a charging/discharging resistor 106 for the capacitor 104. When the voltage of capacitor 70 exceeds the voltage of capacitor 104, then capacitor 104 charges through resistor 106 and when the voltage of capacitor 70 is less than the voltage of capacitor 104, then capacitor 104 discharges through resistor 106. The time constant of resistor 106 and capacitor 104 is large relative to the period of the oscillator 50 to maintain an approximately DC voltage on capacitor 104. Thus, the voltage on capacitor 104 is an approximate average of the sawtooth voltage on capacitor 70. As noted above, the output of amplifier 100 forms the lower reference voltage 60, and is proportional to the difference between the voltage on capacitor 104 and the voltage across a resistor 108. The fixed voltage across resistor 108 is a fraction of the higher reference voltage 58 based on a voltage divider 110. Thus, if the average voltage on capacitor 70 is less than ideal, (i.e. requires adjustment) the reference voltage 60 is adjusted upwardly. A lower than ideal average voltage on capacitor 104 may be due to excess propagation delay between the time that the voltage on capacitor 70 falls below the lower reference voltage 60 and switches 54 and 84 are closed. Such excess propagation delay causes excessive discharge of capacitor 70 and excess duration of the low level output of comparator 52. (While the same propagation delay will likely delay the subsequent closing of switches 56 and 86 after the voltage of capacitor 70 reaches the high reference voltage 58, this is such a small fraction of the relatively long duration of the high state of comparator 52, that it does not significantly affect the duty cycle of the high level or counteract the excess propagation delay between the time that the voltage on the capacitor 70 falls below the lower reference voltage 60 and switches 54 and 84 are closed). Conversely, if the propagation delay between the time that the voltage on the capacitor 70 falls below the lower reference voltage 60 and switches 54 and 84 are closed, the amplifier 100 will output a higher reference voltage than in the ideal case and appropriately shorten the duration of the low level output of comparator 52. The foregoing adjustments to the reference voltage 60 improve the precision of both duty cycles, and particularly maintains high precision on the duration of the shorter duty cycle level.

The following is an example (and guidelines for determining other examples) of the magnitudes of the components of oscillator 50. By way of example, the frequency of oscillator 50 can be in the range of 100 Khz to 2 Mhz with the low level existing for only 75 nanoseconds every cycle. In this example, the higher reference voltage 58 can be 5.1 volts due to availability of a 5.1 volt band gap reference and the lower reference voltage can be approximately 3.1 volt (with adjustments by the averaging circuit 62 of plus or minus 0.75 volts). This yields approximately two volts of "swing" across capacitor 70 which, in a switching power supply environment, is sufficient to overcome background noise. For practical reasons, the discharge current is less than 10 milliamps. Capacitor 70 can be 200 pfs which is a practical size. Current sink 74 should discharge capacitor 70 two volts in 75 nanoseconds and therefore draws 5.34 milliamps. Current source 72 should charge capacitor 70 two volts in the remaining 925 nanoseconds and therefore supplies 0.432 milliamps in this example. As for the averaging circuit 62, resistor 109 can be 2.2 kohms and resistor 108 can be 8 kohms to provide 4 volts at the noninverting input of amplifier 101. The values for resistor 106 and capacitor 104 can be determined as follows. The time constant of capacitor 104 and resistor 106 should substantially filter the AC input/sawtooth from capacitor 70. In the foregoing example, capacitor 104 is 20 picafarads and resistor 106 is 200 Kohms, yielding a 25 to 1 reduction in the AC voltage swing on capacitor 104 compared to that on capacitor 70. The voltage output of amplifier 100 equals the voltage across capacitor 70 divided by the magnitude of resistor 106, divided by the magnitude of capacitor 104 and divided by "S". "S" is related to the operating frequency by a LaPlace transform. The range in voltage adjustment of the averaging circuit 62 above and below the standard voltage swing due to the standard two volt voltage swing across capacitor 70 is limited by the supply voltage to amplifier 100. Voltage 60 will be adjusted to the DC value which produces an average capacitor 70 voltage of four volts DC. Lab results show a range of 4.6 to 3.1 volts for voltage reference 60, depending on temperature and manufacturing tolerance.

Figure 4:
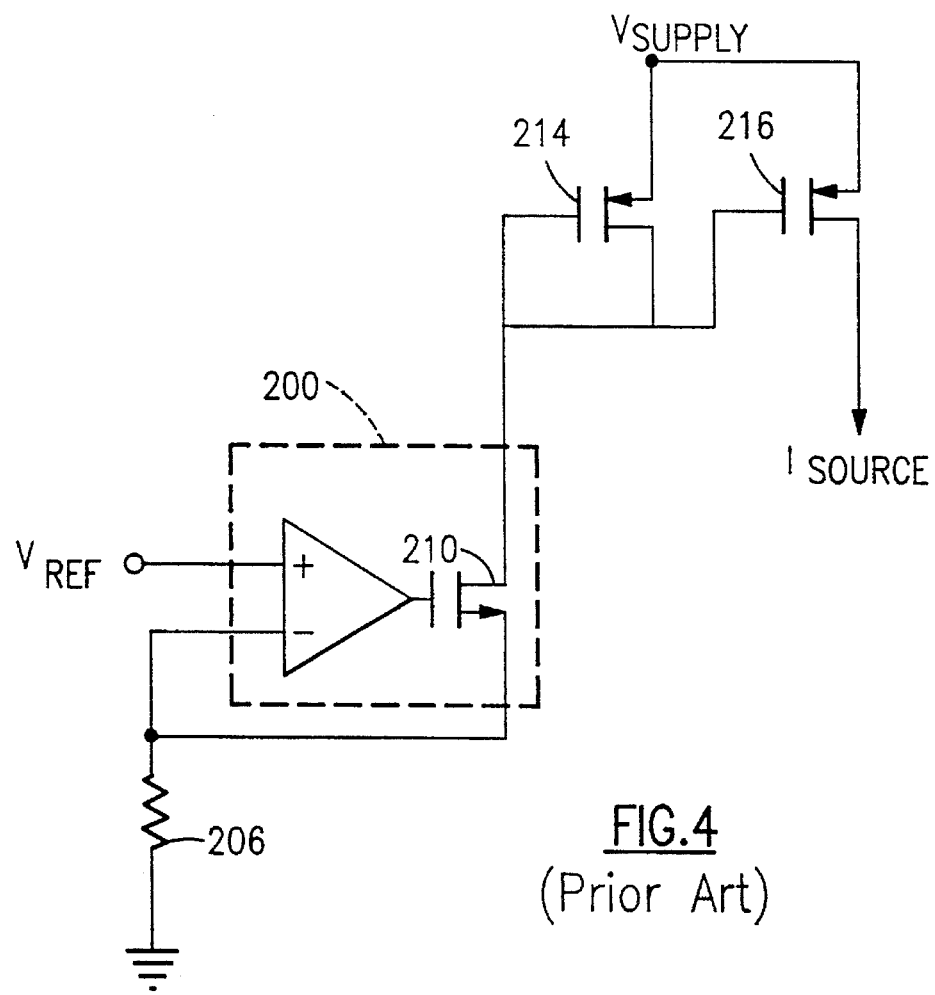
FIG. 4 is a circuit diagram of a conventional current source within the circuit of FIG. 3.

FIG. 4 illustrates current source 72 in more detail. (The current source 72 itself was previously known.) Current source 72 comprises an amplifier 200 whose noninverting input is supplied with a fixed reference voltage, for example reference voltage 58. The output feeds back directly to the inverting input. A resistor 206 is connected between the inverting input of amplifier 200 and ground. Consequently, the current output from the amplifier is the reference voltage divided by the magnitude of resistor 206. In the illustrated embodiment, the output stage of amplifier 200 is an "open collector" transistor 210 such that substantially all the output current through resistor 206 passes through the collector to emitter junction of transistor 210. Current source 72 also includes two matched FET transistors 214 and 216. The current passing through transistor 210 is supplied through transistor 214 and mirrored in transistor 216. Consequently, the output current from transistor 216 equals the reference voltage supplied at the noninverting input to amplifier 200 divided by resistor 206.

Figure 5:
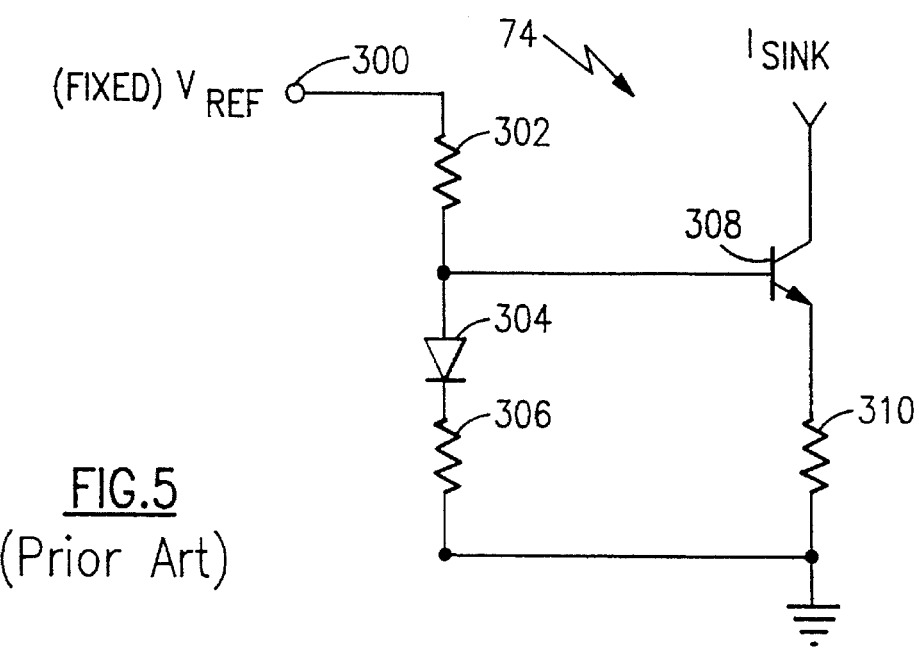
FIG. 5 is a circuit diagram of a conventional current sink within the circuit of FIG. 3.

FIG. 5 illustrates current sink 74 in more detail. (The current sink 74 itself was previously known.) Current sink 74 comprises a fixed reference voltage 300 which develops a current across a resistor 302, a diode 304 and a resistor 306 in series. The current across diode 304 and resistor 306 develops a driving voltage across the base to emitter junction of a transistor 308 and an emitter resistor 310 (connected as an emitter follower). Consequently, the current through the collector to emitter junction of transistor 308—the sinking current, is equal to the reference voltage 300 minus a diode voltage drop times resistor 306 divided by the sum of resistors 302 and 306 and divided by resistor 310. (The voltage drop across diode 304 balances the voltage drop across the base to emitter junction of transistor 308 over a wide range of temperatures and currents.)

DETAILED DESCRIPTION OF AN ALTERNATE EMBODIMENT

Figure 6:
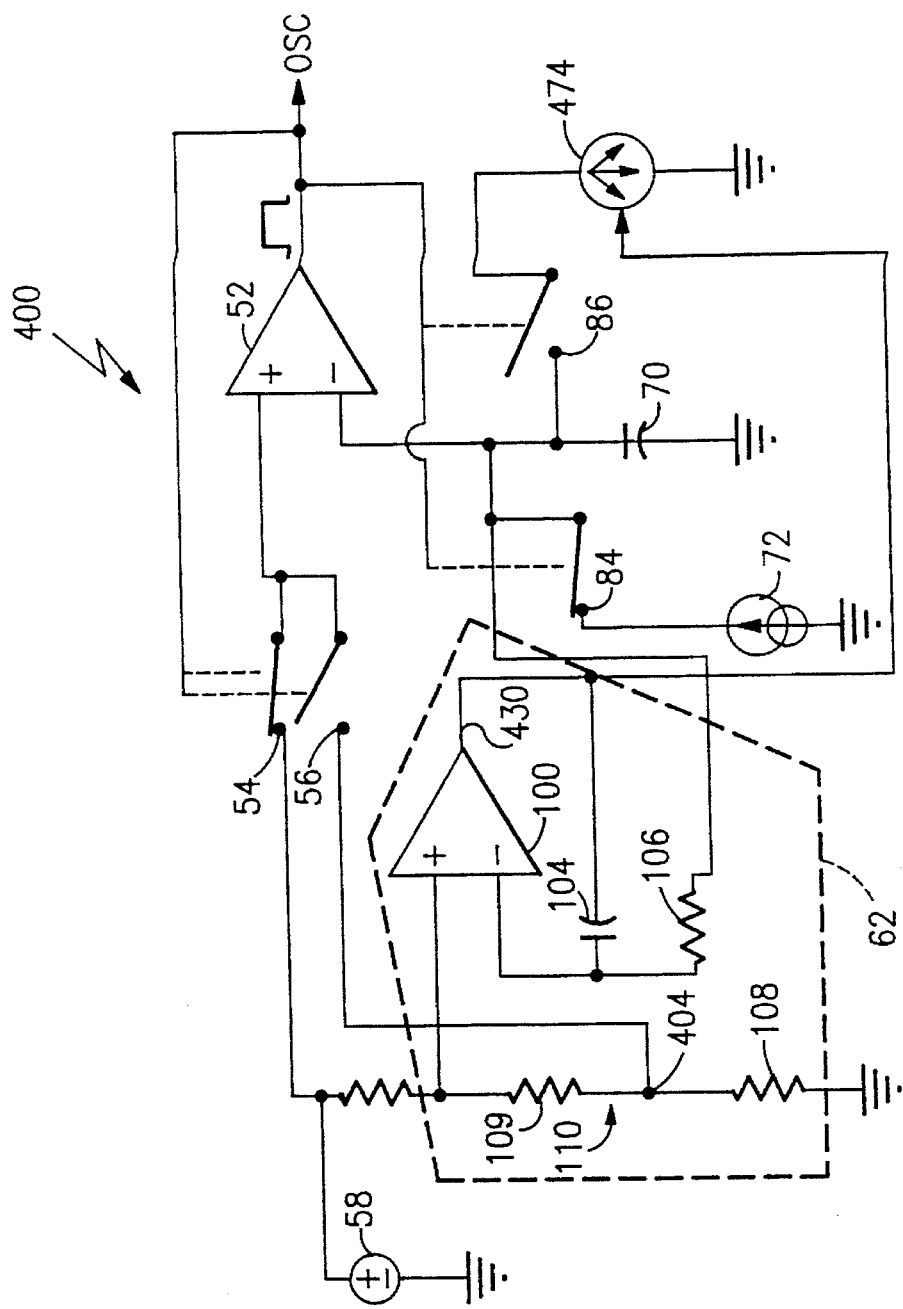
FIG. 6 is a circuit diagram of another, inventive asymmetrical oscillator.

FIG. 6 illustrates an alternate, inventive oscillator generally designated 400 wherein a current sink 474 is adjusted instead of a lower reference voltage as in oscillator 50, to precisely control the duty cycles. The basic operation, without averaging circuit 62 or a control 475, is as follows. When the output of comparator 52 is high, switches 54 and 84 are closed. Thus, the higher reference voltage 58 is applied to the noninverting input of comparator 52, and current source 72 charges capacitor 70. When the voltage across capacitor 70 exceeds the reference voltage 58, the comparator 52 switches to the low level. This opens switches 54 and 84 and closes switches 56 and 86. With switch 56 now closed, a fixed lower reference voltage 404 is applied to the noninverting input of comparator 52 and with switch 86 closed, current sink 474 discharges capacitor 70. When the voltage across capacitor 70 falls below the reference voltage 404, comparator 52 switches back to the high level. Thus, the output of comparator 52 oscillates.

Figure 7:
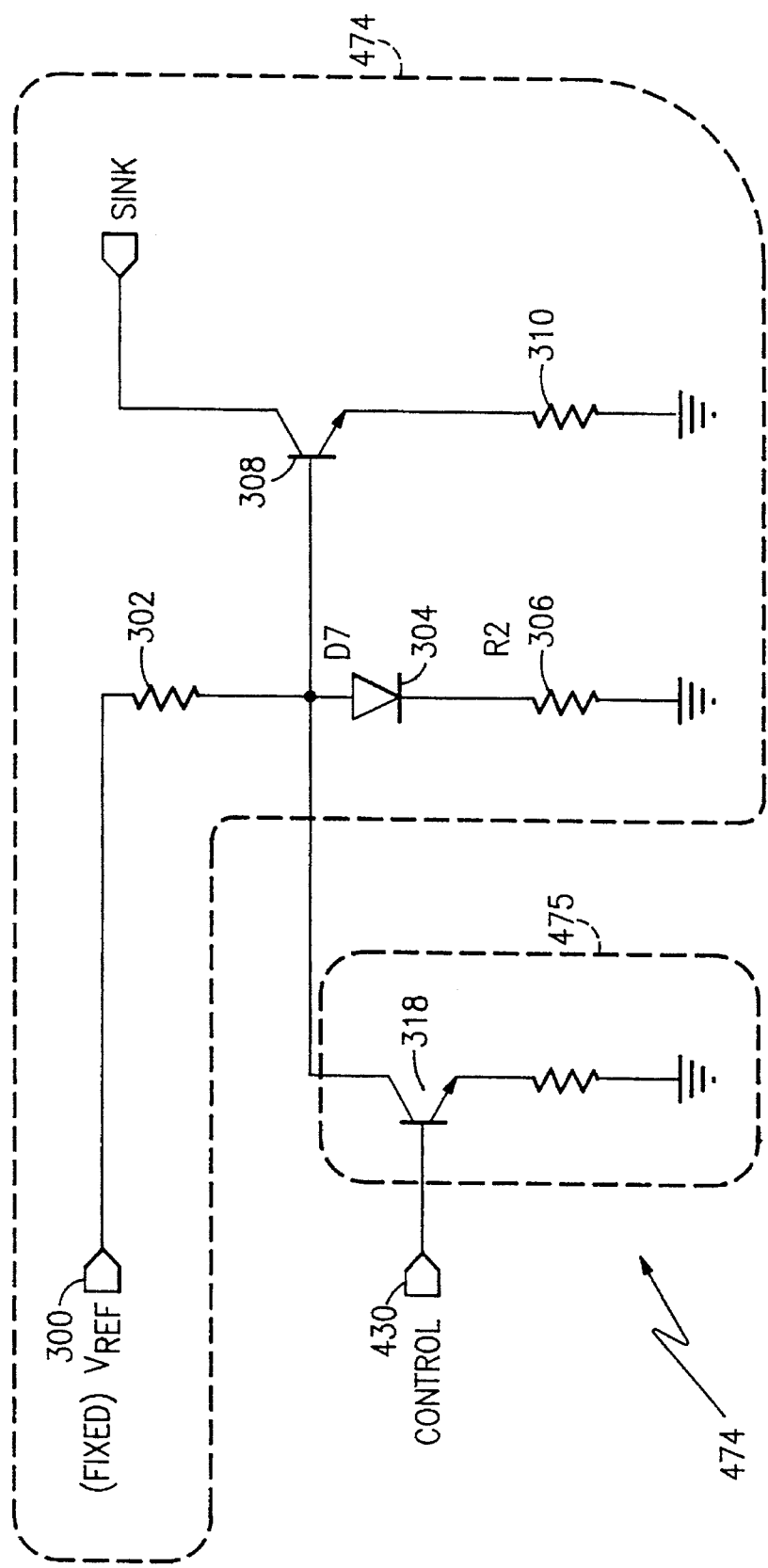
FIG. 7 is a detailed circuit diagram of a current sink within the circuit of FIG. 6.

Averaging circuit 62 and control circuit 475 maintain a precise duty cycle for each level by controlling the current sink 474 (FIG. 7) instead of the lower reference voltage as in oscillator 50. Averaging circuit 62 comprises an amplifier 100, a negative feedback capacitor 104 and a charging/discharging resistor 106 for the capacitor 104. When the voltage of capacitor 70 exceeds the voltage of capacitor 104, then capacitor 104 charges through resistor 106 and when the voltage of capacitor 70 is less than the voltage of capacitor 104, then capacitor 104 discharges through resistor 106. The time constant of resistor 106 and capacitor 104 is large relative to the period of the oscillator 50 to maintain an approximately DC voltage on capacitor 104. Thus, the voltage on capacitor 104 is an approximate average of the sawtooth voltage on capacitor 70. The output 430 of amplifier 100 is proportional to the difference between the voltage on capacitor 104 and the fixed reference voltage across resistors 108 and 109. The voltage across resistors 108 and 109 is a fraction of the higher reference voltage 58. As illustrated in FIG. 7, the reference voltage 430 controls the magnitude of the current sink 474 as follows. When the average voltage on capacitor 70 is less than ideal, (i.e. requires upward adjustment), the reference voltage 430 is adjusted upwardly. The increased reference voltage 430 decreases the voltage at the base of transistor 308 which decreases the magnitude of the current sink. This adjusts the average voltage on capacitor 70 upwardly. A lower than ideal average voltage on capacitor 104 may be due to excess propagation delay between the time that the voltage on capacitor 70 falls below the lower reference voltage 404 and switches 54 and 84 are closed. Such excess propagation delay causes excessive discharge of capacitor 70 and excess duration of the low level output of comparator 52. (While the same propagation delay will likely delay the subsequent closing of switches 56 and 86 after the voltage of capacitor 70 reaches the high reference voltage 58, this is such a small fraction of the relatively long duration of the high state of comparator 52, that it does not significantly affect the duty cycle of the high level or counteract the excess propagation delay between the time that the voltage on the capacitor 70 falls below the lower reference voltage 60 and switches 54 and 84 are closed.) The upward adjustment of the average voltage on capacitor 104 compensates for such excess propagation delay. Conversely, if the propagation delay between the time that the voltage on the capacitor 70 falls below the lower reference voltage 60 and switches 54 and 84 are closed is shorter than expected, then amplifier 100 will output a lower reference voltage than in the ideal case and appropriately increase the current sink 474 and shorten the duration of the low level output of comparator 52. The foregoing adjustments to the reference voltage 430 improve the precision of both duty cycles, and particularly maintain high precision on the duration of the shorter duty cycle level. The same guidelines for selecting values of components in oscillator 50 apply to selecting values of components in oscillator 400.

Figure 8:
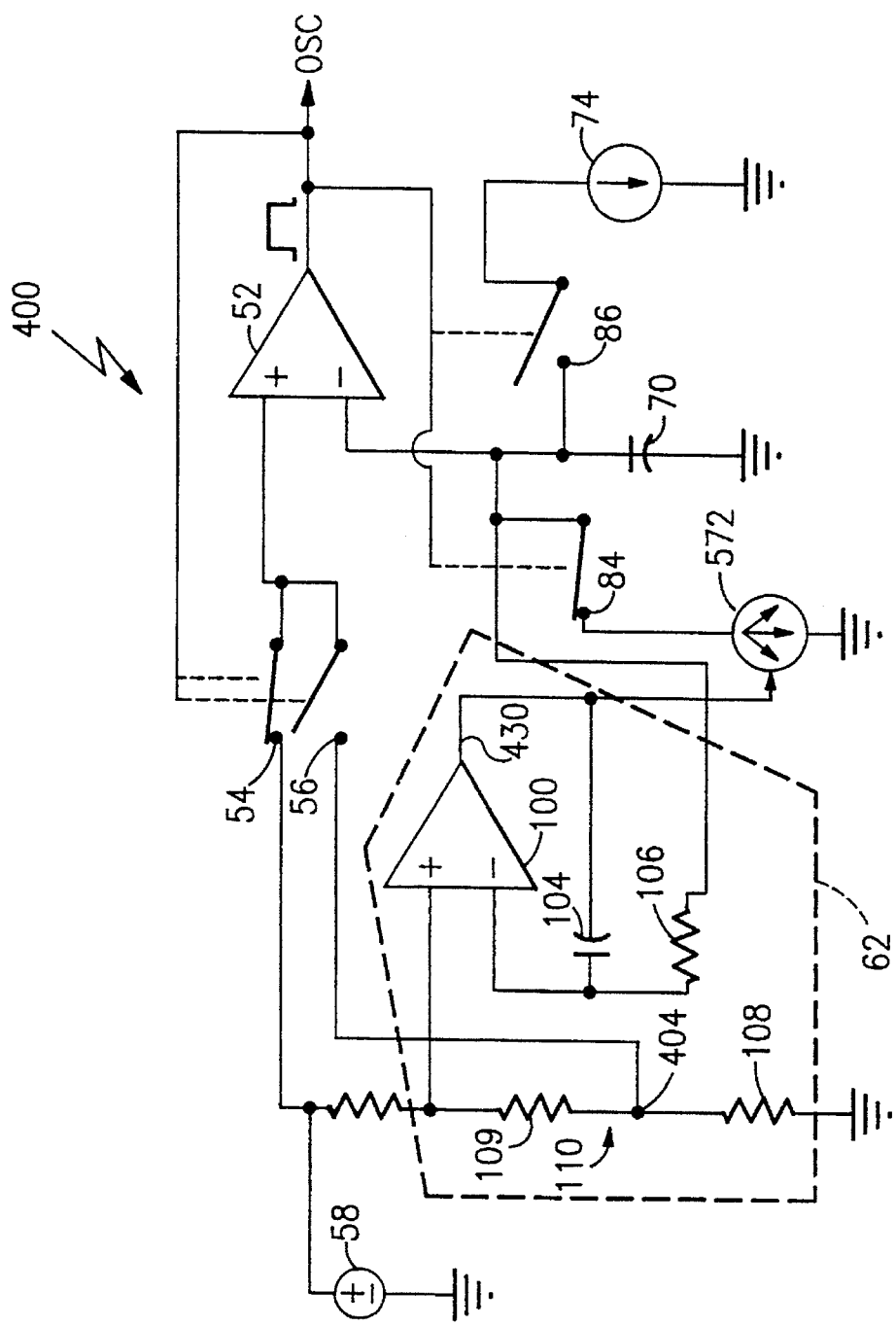
FIG. 8 is a circuit diagram of still another, inventive asymmetrical oscillator.

Based on the foregoing, an oscillator according to the present invention has been disclosed. However, numerous modifications and substitutions can be made without deviating from the scope of the present invention. For example, if desired, the averaging circuit of FIG. 3 can be configured to adjust the high reference voltage instead of the low reference voltage input to amplifier 52 by the following. The reference voltage 58 is connected to switch 56 (as the lower reference voltage) instead of to switch 54. A higher reference voltage than reference 58 is provided to the noninverting input of comparator 100, and the output of comparator 100 (reference voltage 60) is connected to switch 54 (as the higher reference voltage) instead of to switch 56. Also, the averaging circuit 62 of FIG. 6 can be used to adjust a current source 572 in FIG. 8 (instead of the current sink 474 of FIG. 6) by connecting the output of amplifier 100 to a current source control such that as the output of amplifier 100 increases, the current source 572 increases, and vice versa. Current source 74 of FIG. 8 is fixed. Therefore, the invention has been disclosed by way of illustration and not limitation, and reference should be made to the following claims to determine the scope of the present invention.

I claim:

1. An oscillator comprising:

a comparator;

first and second switches for alternately connecting first and second respective reference voltages to a first input of said comparator;

a capacitor connected to a second input of said comparator;

a current source and a current sink;

third and fourth switches for alternately connecting said current source and said current sink, respectively, to said capacitor; and means for adjusting said second reference voltage to maintain desired duty cycles of high and low levels output from said comparator.

2. An oscillator as set forth in claim 1 wherein said first and third switches are closed simultaneously based on one output level of said comparator and said second and fourth switches are closed simultaneously based on the other output level of said comparator.

3. An oscillator as set forth in claim 1 wherein the adjusting means comprises an averaging circuit coupled to average the voltage across said capacitor and generate said second reference voltage to correspond to said average voltage.

4. An oscillator as set forth in claim 3 wherein the averaging circuit comprises an amplifier with a feedback capacitor and a resistor connected between the first said capacitor and said feedback capacitor such that when the voltage of said first capacitor exceeds said feedback capacitor, charging current passes through said resistor to said feedback capacitor and when the voltage of said first capacitor is less than said feedback capacitor, discharging current passes from said feedback capacitor through said resistor.

5. An oscillator as set forth in claim 4 wherein said second reference voltage is always lower than said first reference voltage during operation of said oscillator.

6. An oscillator as set forth in claim 5 wherein said feedback capacitor is connected between the output of said amplifier and an inverting input of said amplifier, and a noninverting input of said amplifier receives a reference voltage.

7. An oscillator as set forth in claim 2 wherein the adjusting means comprises an averaging circuit coupled to average the voltage across said capacitor and generate a corresponding second reference voltage.

8. An oscillator as set forth in claim 7 wherein the averaging circuit comprises an amplifier with a feedback capacitor and a resistor connected between the first said capacitor and said feedback capacitor such that when the voltage of said first capacitor exceeds said feedback capacitor, charging current passes through said resistor to said feedback capacitor and when the voltage of said first capacitor is less than said feedback capacitor, discharging current passes from said feedback capacitor through said resistor.

9. An oscillator comprising:

a comparator;

first and second switches for alternately connecting first and second respective reference voltages to a first input of said comparator;

a capacitor connected to a second input of said comparator;

a current source and a current sink;

third and fourth switches for alternately connecting said current source and said current sink, respectively, to said capacitor; and means for adjusting either said current source or said current sink to maintain desired duty cycles of high and low levels output from said comparator.

10. An oscillator as set forth in claim 9 wherein said first and third switches are closed simultaneously based on one output level of said comparator and said second and fourth switches are closed simultaneously based on the other output level of said comparator.

11. An oscillator as set forth in claim 9 wherein the adjusting means comprises an averaging circuit coupled to average the voltage across said capacitor and generate a third reference voltage to correspond to said average voltage.

12. An oscillator as set forth in claim 11 wherein the averaging circuit comprises an amplifier with a feedback capacitor and a resistor connected between the first said capacitor and said feedback capacitor such that when the voltage of said first capacitor exceeds said feedback capacitor, charging current passes through said resistor to said feedback capacitor and when the voltage of said first capacitor is less than said feedback capacitor, discharging current passes from said feedback capacitor through said resistor.

13. An oscillator as set forth in claim 11 wherein said either current source or current sink comprises an amplifier whose output controls magnitude of said either current sink or current source, and said third reference voltage is an input to said amplifier to control said output of said amplifier.

14. An oscillator as set forth in claim 12 wherein said feedback capacitor is connected between the output of said amplifier and an inverting input of said amplifier, and a noninverting input of said amplifier receives a reference voltage.

15. An oscillator as set forth in claim 10 wherein the adjusting means comprises an averaging circuit coupled to average the voltage across said capacitor and generate a corresponding third reference voltage.

16. An oscillator as set forth in claim 15 wherein the averaging circuit comprises an amplifier with a feedback capacitor and a resistor connected between the first said capacitor and said feedback capacitor such that when the voltage of said first capacitor exceeds said feedback capacitor, charging current passes through said resistor to said feedback capacitor and when the voltage of said first capacitor is less than said feedback capacitor, discharging current passes from said feedback capacitor through said resistor.

17. An oscillator comprising:

a comparator;

first and second switches for alternately connecting first and second respective reference voltages to a first input of said comparator;

a capacitor connected to a second input of said comparator;

a current source and a current sink;

means for alternately connecting said current source and said current sink, respectively, to said capacitor; and means for adjusting said second reference voltage to maintain desired duty cycles of high and low levels output from said comparator.

18. An oscillator as set forth in claim 17 wherein the connecting means connects said current source to said capacitor when said first switch is closed and connects said current sink to said capacitor when said second switch is closed.

19. An oscillator as set forth in claim 18 wherein the connecting means and said first and second switches are opened and closed based on output levels of said comparator.

20. An oscillator as set forth in claim 17 wherein the adjusting means comprises an averaging circuit coupled to average the voltage across said capacitor and generate a corresponding second reference voltage.

21. A method for generating oscillations, said method comprising the steps of:

alternately connecting first and second respective reference voltages to a first input of a comparator;

coupling a capacitor to a second input of said comparator and alternately charging and discharging said capacitor between said first and second reference voltages to cause said comparator to alternately output high and low levels; and adjusting said second reference voltage to maintain desired duty cycles of said high and low levels output from said comparator.

22. A method as set forth in claim 21 wherein the adjusting step comprises the steps of:

averaging a voltage of said capacitor; and adjusting said second reference voltage based on the average voltage.

23. A method for generating oscillations, said method comprising the steps of:

alternately connecting first and second respective reference voltages to a first input of a comparator;

coupling a capacitor to a second input of said comparator and, using a current source and current sink, alternately charging and discharging said capacitor between said first and second reference voltages to cause said comparator to alternately output high and low levels; and adjusting either said current source or said current sink to maintain desired duty cycles of said high and low levels output from said comparator.

24. A method as set forth in claim 23 wherein the adjusting step comprises the steps of:

averaging a voltage of said capacitor; and adjusting said either current source or said current sink based on the average voltage.

* * * * *